United States Patent
Toumatsu

[11] Patent Number: 6,031,230
[45] Date of Patent: Feb. 29, 2000

[54] REFLECTED ELECTRON DETECTOR AND A SCANNING ELECTRON MICROSCOPE DEVICE USING IT

[75] Inventor: Jiro Toumatsu, Tokyo, Japan

[73] Assignee: Kabushiki Kaisha Topcon, Tokyo, Japan

[21] Appl. No.: 08/966,923

[22] Filed: Nov. 10, 1997

[30] Foreign Application Priority Data

Nov. 11, 1996 [JP] Japan .................................. 8-298769

[51] Int. Cl.[7] .......................... H01J 37/28; H01J 37/244
[52] U.S. Cl. ........................... 250/310; 250/397; 250/399
[58] Field of Search .................................. 250/310, 309, 250/397, 399

[56] References Cited

U.S. PATENT DOCUMENTS

| | | | |
|---|---|---|---|
| 3,629,579 | 12/1971 | Naitou | 250/442.11 |
| 4,177,379 | 12/1979 | Fuukawa et al. | 250/310 |
| 4,217,495 | 8/1980 | Robinson | 250/310 |
| 4,438,332 | 3/1984 | Lichtenegger | 250/397 |
| 4,559,450 | 12/1985 | Robinson et al. | 250/310 |
| 5,043,583 | 8/1991 | Robinson | 250/397 |
| 5,191,213 | 3/1993 | Ahmed et al. | 250/310 |
| 5,198,675 | 3/1993 | Hikita et al. | 250/310 |

*Primary Examiner*—Bruce C. Anderson
*Attorney, Agent, or Firm*—Haynes & Boone, L.L.P.

[57] ABSTRACT

In a scanning electron microscope device having the plastic scintillator type reflected electron detector 17 that is installed below the front end surface 14a of the object lens 14 to detect reflected electrons from the specimen, the reflected electron detector 17 has the front end portion 38 of its scintillator 17a formed into the semicircular portion 44 having a radius almost equal to the radius of the front end surface 14a of the object lens 14. At least a part of the edge of the semicircular portion 44 is formed with the notched surface 39 that extends along the extension of the inclined surface 14b of the object lens 14. This increases the viewing angle of the optical microscope, which is used to locate the position of the specimen being observed, and also increases the solid angle of the detection plane of the detector with respect to the specimen. The reflected electron detector thus can arrest reflected electrons from the specimen efficiently.

7 Claims, 5 Drawing Sheets

REFLECTED ELECTRON DETECTOR AND A SCANNING ELECTRON MICROSCOPE DEVICE USING IT

FIELD OF THE INVENTION

The present invention relates to a scanning electron microscope device having a reflected electron detector and more specifically to a scanning electron microscope device having a plastic scintillator.

DESCRIPTION OF RELATED ART

The scanning electron microscope device detects secondary electrons produced by the scanning of electron beams over a specimen to image the surface of the specimen and at the same time detects reflected electrons and X rays from the specimen to form a reflected electron image of the specimen's surface and perform an X-ray analysis.

In such a scanning electron microscope device, an example detector for detecting reflected electrons includes a reflected electron detector using a plastic scintillator as shown in FIG. 5. This reflected electron detector 50 is constructed of a plastic scintillator and has a detection unit 51 with a hole 51a through which to pass an electron beam probe, a photomultiplier tube 55, and a signal amplifier 56.

The reflected electron detector 50 has the front end of the detection unit 51 disposed between a specimen 52 and an object lens 53 and converts, by the detection unit 51, reflected electrons 54 from the specimen 52 into light, which is then amplified by the photomultiplier tube 55 to produce a reflected electron signal, which is amplified by an amplifier 56. The amplified signal is then displayed on a display unit 57 in synchronism with the scanning of the electron beam probe In this way by analyzing the reflected electrons from the specimen, it is possible to obtain an image of the topography of the surface of the specimen 52 and information on the compositional distribution of the specimen 52.

In such a scanning electron microscope device, an optical microscope may be used to locate the position of an area in the specimen currently under examination or to position an area in the specimen one wishes to observe near the center of the range of electron beam scanning and produce a scanning electron microscopic image of a target area swiftly.

Such an optical microscope is positioned to observe the specimen 52 diagonally from the side of the object lens 53 of the scanning electron microscope device.

The direction of observation by the optical microscope should preferably be perpendicular to the specimen, i.e., positioned close to the irradiation angle of the electron beam probe. This allows swift and easy observation of a target area in the specimen. The process of observation involves aligning in the positional relationship (vertical and lateral) an image produced by the optical microscope with an image produced by the scanning electron microscope, positioning the target area of observation with an optical microscope with a wide field of view, and then switching to the scanning electron microscope for observation.

In addition to performing observation by detecting secondary electron beams and reflected electrons, the scanning electron microscope of this kind detects X rays emitted from the specimen to analyze elements of the specimen by using an energy type element analyzer using X ray (EDX). In this case, an X-ray detector needs to be installed in the specimen chamber.

The X-ray detector should preferably arrange an X-ray detection surface at as large a solid angle as possible with respect to the probe irradiation area on the specimen so as to detect X rays efficiently.

The detection unit 51 of the reflected electron detector should be arranged to cover the specimen 52 as much as possible because reflected electrons are emitted radially from the specimen 52.

It is therefore an object of this invention to provide a scanning electron microscope device, which allows an optical microscope used to locate the specimen's position to have a large viewing angle and also enables the detection surface of the X-ray detector of the element analyzing device to have as wide a solid angle and a viewing angle as possible with respect to the observation point on the specimen; and which allows the reflected electron detector to receive a large amount of reflected electrons from the specimen.

DISCLOSURE OF THE INVENTION

According to the first aspect of this invention, the reflected electron detector comprises: a scintillator disposed between an object lens and a specimen to detect reflected electrons; wherein the scintillator has a front end portion thereof formed into a semicircular portion with a radius almost equal to the radius of a front end surface of the object lens.

According to the second aspect of this invention, the reflected electron detector comprises: a scintillator disposed between an object lens and a specimen to detect reflected electrons; wherein at least a part of a circumferential edge of the front end portion of the scintillator is formed with a notched surface that extends along an inclined surface of the object lens.

According to the third aspect of this invention, the reflected electron detector comprises: a scintillator disposed between an object lens and a specimen to detect reflected electrons; wherein the scintillator has a front end portion thereof formed into a semicircular portion with a radius almost equal to the radius of a front end surface of the object lens and at least a part of a circumferential edge of the front end portion is formed with a notched surface that extends along a frustoconical inclined surface of the object lens.

According to the fourth aspect of this invention, the reflected electron detector having features described in the first, second or third aspect is characterized in that the front end portion of the scintillator is provided with an electron beam transmission hole to pass an electron beam and also with a downwardly expanding recess extending from the electron beam transmission hole.

According to the fifth aspect of this invention, a scanning electron microscope device includes the reflected electron detector having features described in the first, second, third or fourth aspect.

According to the sixth aspect of this invention, a scanning electron microscope device having features described in the fifth aspect includes an optical microscope.

According to the seventh aspect of this invention, a scanning electron microscope device having features described in the fifth aspect includes a secondary electron detector.

According to the eighth aspect of this invention, a scanning electron microscope device having features described in the fifth aspect includes an X-ray detector of an X-ray analyzer (EDX).

In the scanning electron microscope device of this invention, the front end portion 38 of the reflected electron detector 17 is provided with a semicircular portion 44 having a radius almost equal to the radius of a front end surface 14a of the object lens 14, and at least a part of the circumferential edge of the semicircular portion 44 is formed with a notched surface 39 running parallel to an extension of the inclined surface 14b of the object lens 14.

Because the front end portion 38 of the reflected electron detector 17 does not protrude outwardly beyond the front end surface 14a of the object lens 14, other detectors, such as a secondary electron detector 7, an optical microscope 19 and an X-ray detector 42, are not subject to limitations caused by the installation of the reflected electron detector 17 and can be located at optimum positions.

Further, because the optical microscope 19 can observe the specimen 5 from the direction of the notched surface 39 formed at the front end portion 38 of the reflected electron detector 17, it is possible to observe the specimen 5 at a maximum possible viewing angle, i.e., from a direction along the inclined surface 14b of the object lens 14, without the front end portion 38 of the reflected electron detector 17 entering into the field of view.

Further, with this scanning electron microscope device of this invention, because a downwardly expanding recess 41 with its center at the electron beam transmission hole 40 is formed at the front end portion 38 of the reflected electron detector 17, the downwardly expanding recess 41 encloses the point on the specimen 5 irradiated by the electron beam probe and can arrest reflected electrons efficiently.

BEST MODE FOR CARRYING OUT THE INVENTION

An embodiment of the scanning electron microscope device of this invention will be described by referring to the accompanying drawings.

FIG. 1 to 4 show the configuration of noe embodiment of the scanning electron microscope device according to this invention.

This embodiment corresponds to claims 1, 2, 3, 4 and 5 of this invention.

First, let us explain about the overall structure of the scanning electron microscope device of this embodiment.

Figure 4:
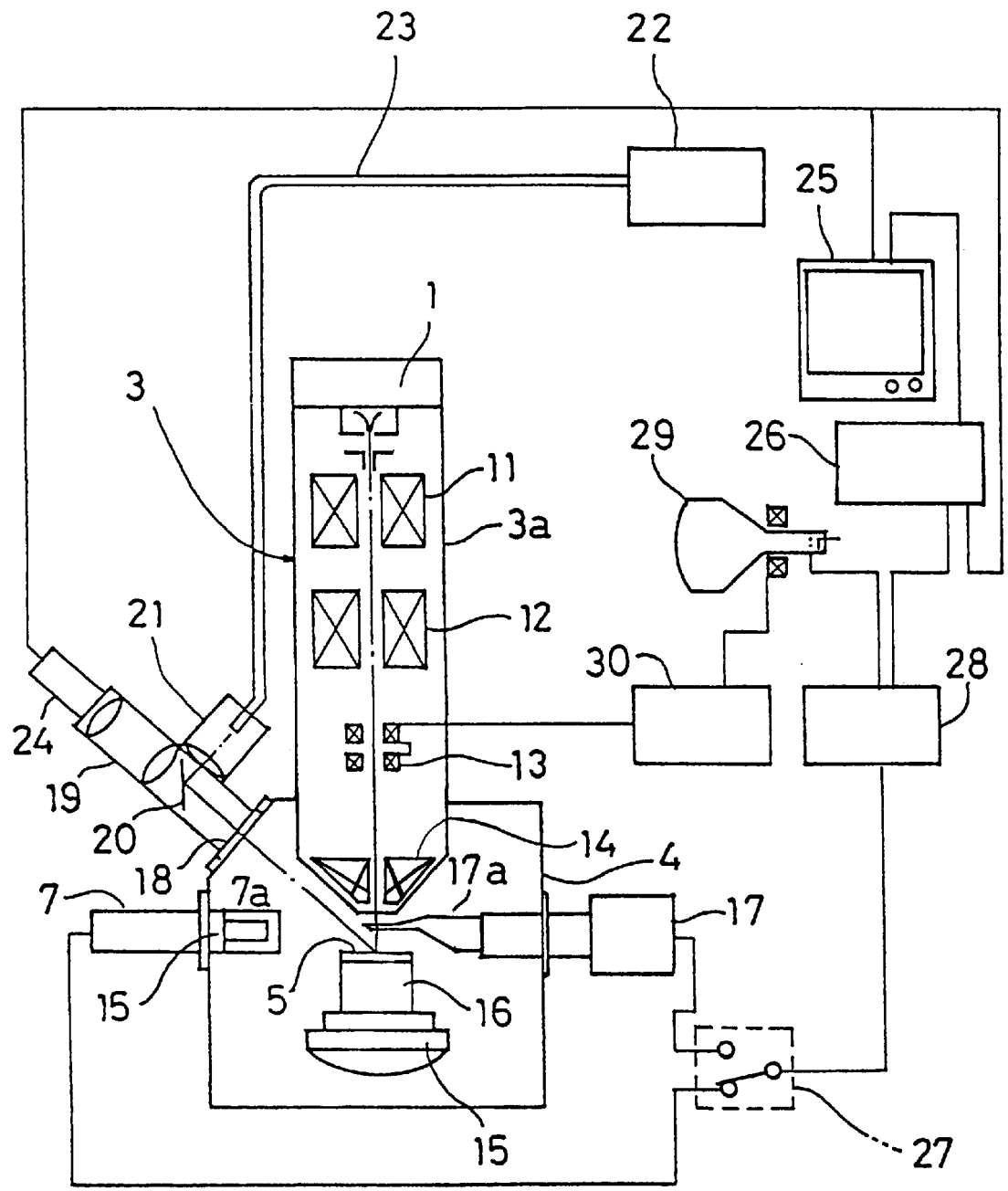
FIG. 4 is a block diagram showing the overall configuration of the scanning electron microscope device of FIG. 1.
Figure 5:
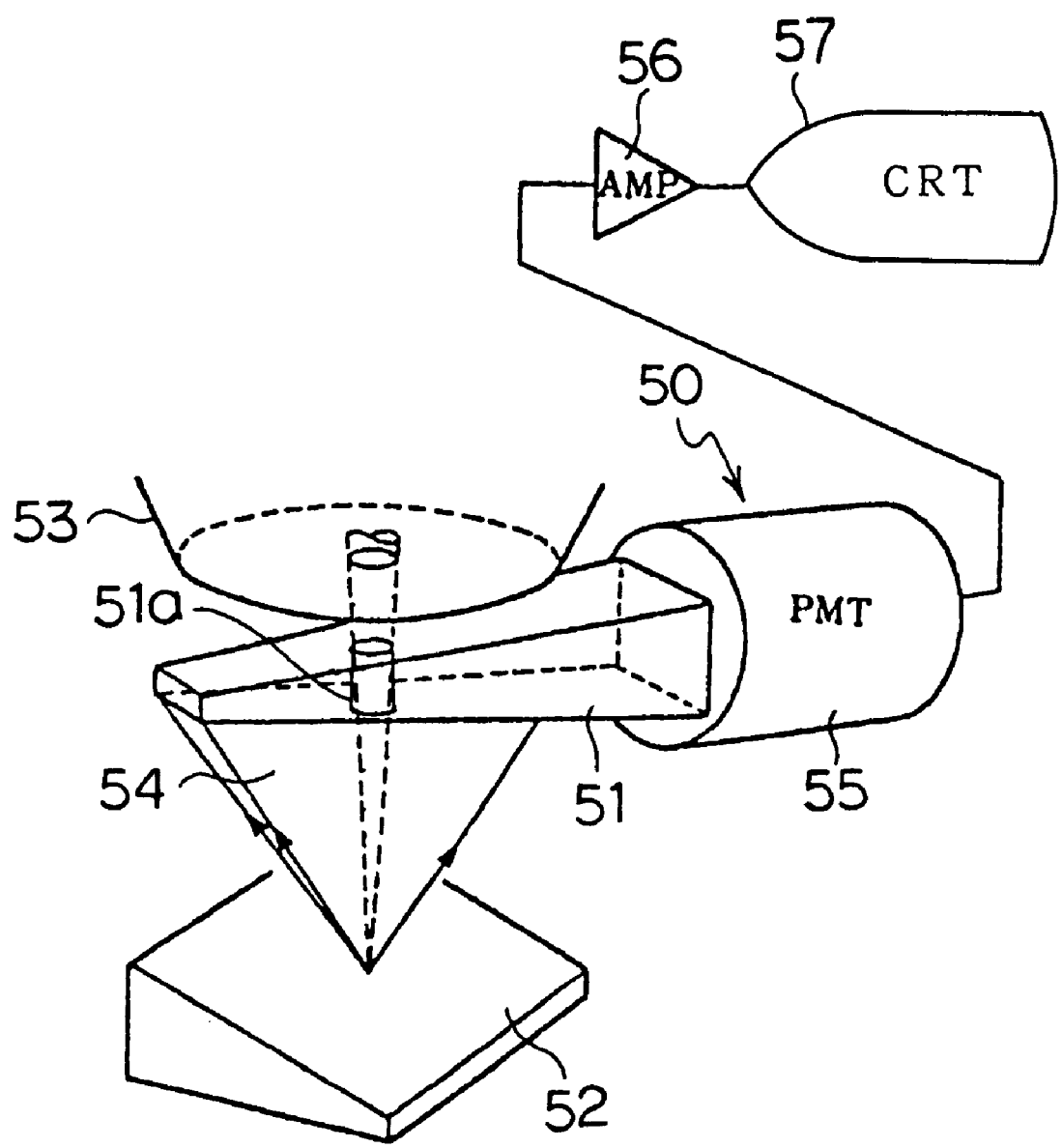
FIG. 5 is a perspective view showing the reflected electron detector of a conventional scanning electron microscope device.

As shown in FIG. 4, the scanning electron microscope device 3 erected on a specimen chamber 4 has an electron gun 1 that emits an electron beam and a microscope cylinder 3a that accommodates an electron beam focusing and scanning mechanism which focuses the electron beam emitted from the electron gun 1 on a specimen's surface as a probe and scans it over the surface.

In the interior of the specimen chamber 4, a specimen 5 is placed on a specimen mount 16 on a movable stage 15 and is scanned by an electron beam probe. Installed in the specimen chamber 4 are a secondary electron detector 7 that arrests secondary electrons emitted from the specimen 5, a reflected electron detector 17 using a plastic scintillator for arresting reflected electrons, an X-ray detector 42 (not shown in FIG. 4; see FIG. 3) of the EDX, an optical microscope 19 with a long focal distance for optically observing the surface of the specimen, and a specimen inlet/outlet port 43 (not shown in FIG. 4; see FIG. 3) through which the specimen is taken in or out.

In this example, the vertically disposed microscope cylinder 3a has its lower end projecting down into the specimen chamber 4 from its top surface. The microscope cylinder 3a accommodates, from top to bottom, an electron gun 1, a first condenser lens 11, a second condenser lens 12, a scanning coil 13, and an object lens 14.

Below the lower end of the microscope cylinder 3a is arranged a stage 15 that can be moved in X- and Y-axis directions, rotated, inclined and, through a vertical motion mechanism, tilted in any desired direction. A specimen 5 is placed on a specimen mount 16 arranged on the stage 15, which is situated immediately below the lower end of the microscope cylinder 3a.

At an upper corner of the specimen chamber 4 is provided an optical microscope mounting window 18, in which an optical microscope 19 is installed. The optical microscope 19 has a long focal distance, for example, more than 100 mm and the focal point is on the surface of the specimen 5. The optical microscope 19 has a wide field of view enough to cover the entire area of the specimen mount 16, with the maximum field of view ranging from 15 mmφ to 30 mmφ to enable observation close to that obtained by naked eye. The optical microscope 19 also has a zooming mechanism.

The field of view of the optical microscope 19 is illuminated by a coaxial illumination system. That is, the optical microscope 19 has a half mirror 20 installed therein and is connected with a coaxial illumination unit 21 facing the half mirror 20. Light from a cool light source 22 having, for example, an incandescent light as a light source is led through a fiber cable 23 and is reflected by the half mirror 20 in the same direction as the light axis of the optical microscope 19 and introduced to the specimen 5.

On the eyepiece side of the optical microscope is provided a photographing means such as a CCD photographing device 24. An image produced by the optical microscope 19 is converted by the CCD photographing device 24 into electric signals that are displayed on a color monitor 25 and at the same time entered into an image processor 26.

The image processor 26 has an image storage means (not shown) and can store an image produced by the optical microscope 19. The image processor 26 can also display stored images on the color monitor 25 as required.

The secondary electron detector 7 and the reflected electron detector 17 are connected through a switching circuit 27 to a signal amplifier 28 to supply the signals from the secondary electron detector 7 and the reflected electron detector 17 through the signal amplifier 28 and the image processor 26 to an image display means such as color monitor 25 and CRT 29. A scan circuit 30 of the CRT 29 also drives a scan coil 13 at the same time to scan the CRT 29 in synchronism with the sweeping action of the scan coil 13.

Next, the reflected electron detector 17 of the scanning electron microscope device 3 of this invention will be explained.

Figure 1A:
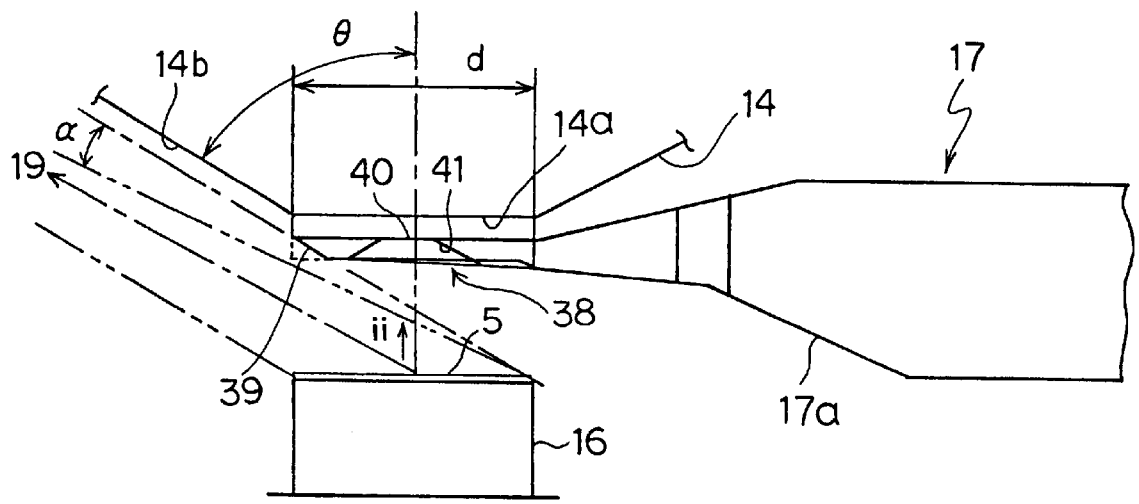
FIG. 1 is a schematic diagram showing one embodiment of the scanning electron microscope device according to this invention, FIG. 1A being a side view and FIG. 1B being a bottom view of a reflected electron detector as seen from the arrow ii of FIG. 1A.
Figure 1B:
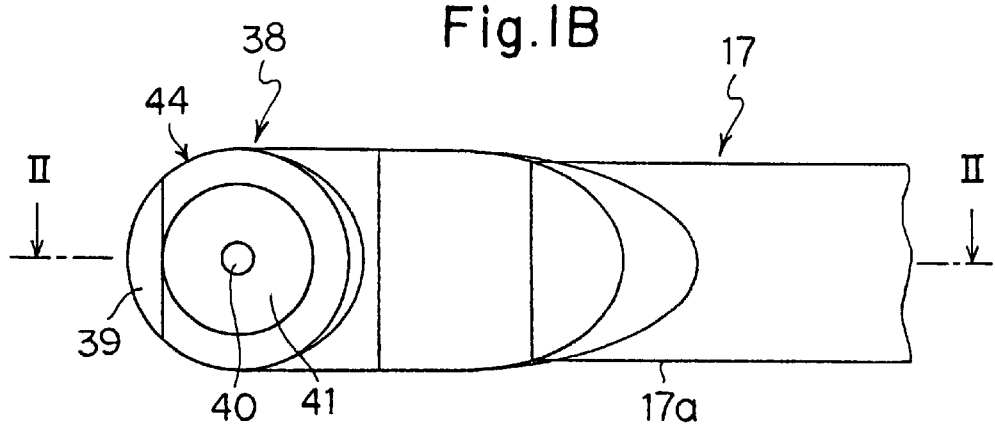
Figure 2:
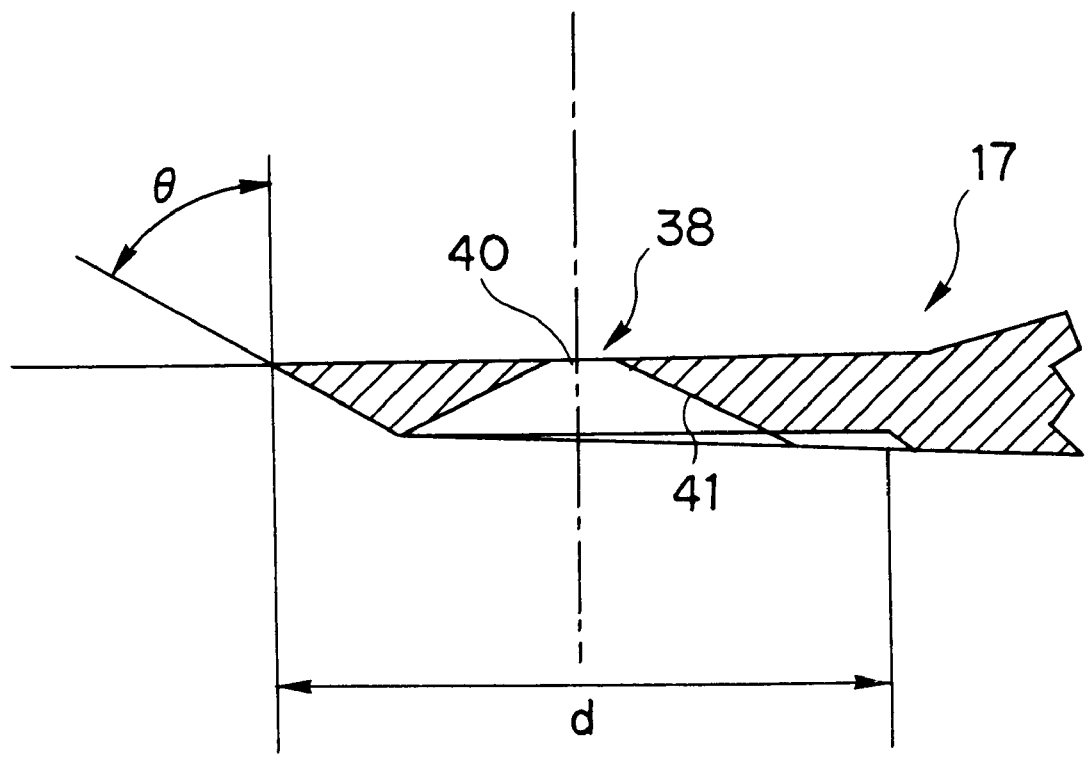
FIG. 2 is a cross section taken along the line II—II of FIG. 1B showing the reflected electron detector of the scanning electron microscope device of FIG. 1.
Figure 3:
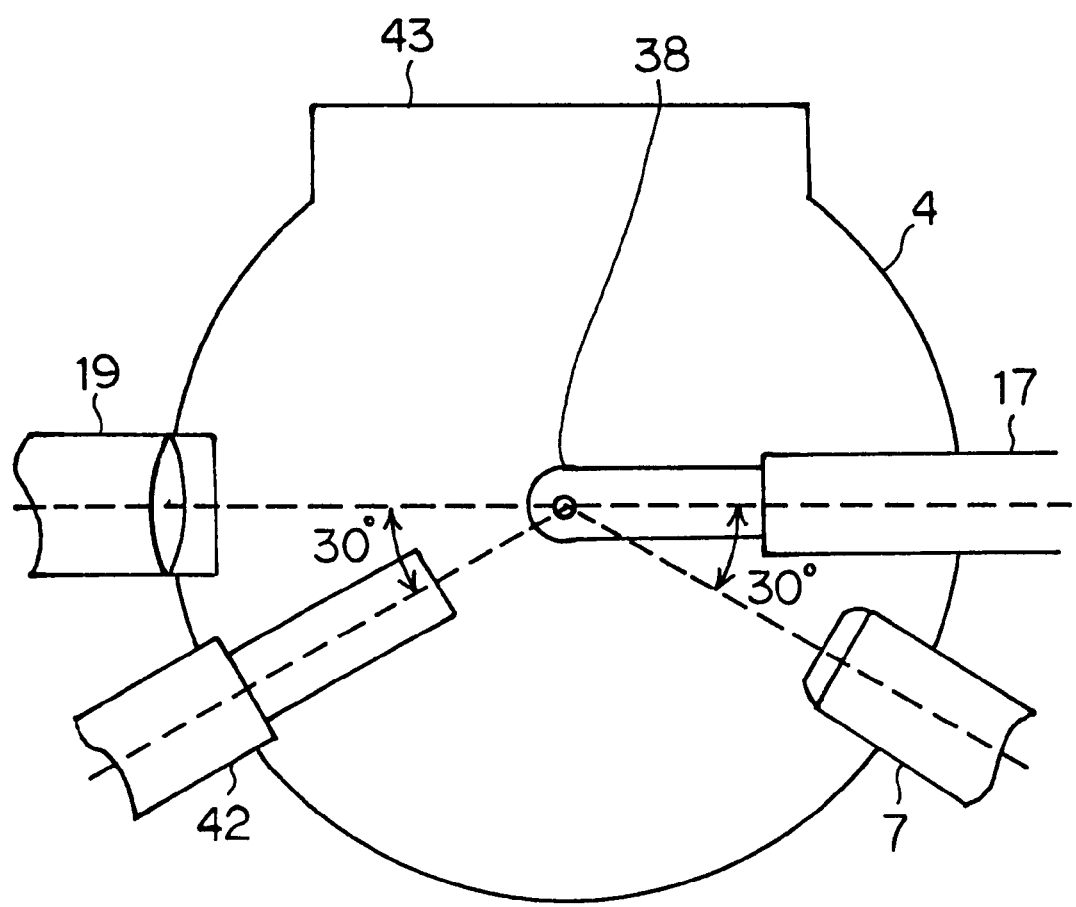
FIG. 3 is a schematic plan view showing an example arrangement of detectors installed in the specimen chamber of the scanning electron microscope device of FIG. 1.

FIG. 1A is a side view showing the reflected electron detector 17 together with the object lens 14 and the specimen mount 16. FIG. 1B is a bottom view of the reflected electron detector 17 as seen from below (in a direction ii of FIG. 1A. FIG. 3 is an enlarged cross section of the reflected electron detector 17.

The reflected electron detector 17 is installed below a front end surface 14a of the object lens 14 to detect reflected electrons from the specimen 5.

In this example, the object lens 14 is shaped like a truncated cone tapering off toward the front, as shown in FIG. 1A. The inclination angle θ of the truncated cone from the electron beam axis is about 60° and the diameter d of its front end surface 14a is 20 mm.

The reflected electron detector 17 of this embodiment comprises a scintillator 17a, a photomultiplier tube (PMT) and a preamplifier. The scintillator 17a is formed of scintillation plastic, as with the conventional reflected electron detector. The front end portion 38 of the scintillator 17a has a semicircular portion 44 with a radius (20 mm) equal to that of the front end surface 14a of the object lens 14, as shown in FIG. 1A and B and FIG. 2, and the front end of the semicircular portion 44 is formed with a notched surface 39 that has almost the same inclination as an extension of the inclined surface 14b of the object lens 14.

This notched surface 39 has an inclination almost equal to that of an extension of the inclined surface 14b of the object lens 14, i.e., it is inclined 60° from the electron beam axis (30° from the horizontal plane). The semicircular portion 44 of the front end portion 38 is preferably made thin (in this example, 3 mm).

The front end portion 38 of the reflected electron detector 17 is formed with an electron beam transmission hole 40 to pass the electron beam probe. The front end portion 38 also has an inverted funnel-shaped, downwardly expanding recess 41 with the electron beam transmission hole 40 as a center.

FIG. 3 shows a schematic diagram showing the arrangement of various detectors of the scanning electron microscope device 3 of this embodiment.

In this embodiment, the specimen chamber 4 has a specimen inlet/outlet port 43 through which to take the specimen 5 into or out of the specimen chamber 4, and accommodates the above-mentioned reflected electron detector 17, secondary electron detector 7, X-ray detector 42 and optical microscope 19.

The optical microscope 19 has an optical axis that extends along the inclined surface 39 of the front end portion 38 of the reflected electron detector 17 and intersects the electron beam axis on the specimen 5.

That is, the optical microscope 19 is arranged at a position symmetrical to the insertion position of the reflected electron detector 17 with respect to the electron beam axis. The secondary electron detector 7 is arranged at a position 30° apart from the reflected electron detector 17 on the side opposite the specimen inlet/outlet port 43. The X-ray detector 42 of the EDX is arranged at a position 30° apart from the optical microscope 19 on the side opposite the specimen inlet/outlet port 43.

Although, in the above embodiment, the X-ray detector 42 and the secondary electron detector 7 are situated 30 degrees apart from the line connecting the reflected electron detector 17 and the optical microscope 19, their positions are not limited to this example.

That is, because the reflected electron detector 17 of the scanning electron microscope device 3 of this embodiment has the scintillator 17a whose front end portion is formed into the semicircular portion 44 with an inclined surface at the end having an angle almost equal to the inclined surface 14b of the object lens, it is possible to arrange other detectors at any desired angle with respect to the reflected electron detector 17 and keep the detection efficiency high.

The optical microscope 19 is preferably positioned as shown in the above embodiment in order that the image observation plane of the optical microscope 19 can be coordinated in vertical and lateral position with the direction of movement of the specimen and the scan direction of the electron microscope.

The position where the notched surface 39 is formed is not limited to the above example and may be formed in other part or at a plurality of locations or along the entire circumference.

According to the scanning electron microscope of this embodiment, the reflected electron detector 17 with a plastic scintillator has its front end portion 38 formed into a semicircular portion 44 with a radius almost equal to that of the front end surface 14a of the object lens 14 and at least a part of the circumferential edge of the front end portion 38 is formed with the notched surface 39 that extends along an extension of the inclined surface 14b of the object lens 14. Because of this construction, the circumferential edge of the front end portion 38 of the reflected electron detector 17 does not protrude outwardly beyond the front end surface 14a of the object lens 14, allowing other detectors, such as the X-ray detector 42, to be located at a position that assures the maximum detection efficiency without any restriction that would otherwise accompany the arrangement of the reflected electron detector 17.

Because the optical microscope 19 is designed to observe the specimen 5 from the direction of the notched surface 39 of the front end portion 38 of the reflected electron detector 17, it is possible to observe the specimen 5 at a maximum possible viewing angle without the front end portion 38 of the reflected electron detector 17 entering into the field of view. This in turn minimizes distortions of the image and increases the focal range.

If this state with a notched surface is compared with a case where the notched surface 39 is not provided (shown in an imaginary line in FIG. 1), it is seen that the viewing angle is greater than the latter case by an amount α.

Further, in the scanning electron microscope device of this invention, because the downwardly expanding recess 41 with its center at the electron beam transmission hole 40 is formed in the front end portion 38 of the reflected electron detector 17, the reflected electrons can be arrested with high efficiency.

The advantages of the scanning electron microscope device of this invention may be summarized as follows.

Because the reflected electron detector has its front end portion formed into a semicircular portion with a radius almost equal to that of the front end surface of the object lens and at least a part of the edge of the semicircular portion is formed with a notched surface that extends along or inside an extension of the inclined surface of the object lens, the front edge of the semicircular portion of the reflected electron detector does not protrude outwardly beyond the front end surface of the object lens, freeing other detectors, such as a secondary electron detector and an X-ray detector of the X-ray analyzer, from limitations caused by the reflected electron detector and allowing them to be located at positions that assure the maximum detection efficiency.

Further, because the optical microscope can observe the specimen from the direction of the notched surface formed at the front end portion of the reflected electron detector, it is possible to observe the specimen at a maximum possible viewing angle without the front end portion of the reflected electron detector entering into the field of view.

Further, with this scanning electron microscope device of this invention, because a downwardly expanding recess with its center at the electron beam transmission hole is formed at the front end portion of the reflected electron detector, the reflected electrons can be arrested efficiently.

What is claimed is:

1. A reflected electron detector comprising:

a scintillator disposed between an object lens and a specimen to detect reflected electrons;

wherein at least a part of a circumferential edge of the front end portion of the scintillator is formed with a notched surface that extends along an inclined surface of the object lens, the front end portion having an electron beam transmission hole to pass an electron beam therethrough.

2. A reflected electron detector comprising:

a scintillator disposed between an object lens and a specimen to detect reflected electrons;

wherein the scintillator has a front end portion thereof formed into a semicircular portion with a radius almost equal to the radius of a front end surface of the object lens and at least a part of a circumferential edge of the front end portion is formed with a notched surface that extends along a frustoconical inclined surface of the object lens, the front end portion having an electron beam transmission hole to pass an electron beam therethrough.

3. A reflected electron detector according to claim 1 or 2, wherein the front end portion of the scintillator has a downwardly expanding recess extending from the electron beam transmission hole.

4. A scanning electron microscope device having the reflected electron detector of claim 1 or 2.

5. A scanning electron microscope device according to claim 4, including an optical microscope.

6. A scanning electron microscope device according to claim 4, including a secondary electron detector.

7. A scanning electron microscope device according to claim 4, including an X-ray detector of an X-ray analyzer.

* * * * *